United States Patent [19]
Akiyama et al.

[11] Patent Number: 5,493,139
[45] Date of Patent: Feb. 20, 1996

[54] ELECTRICALLY ERASABLE PROM ($E^2$PROM) WITH THIN FILM PERIPHERAL TRANSISTOR

[75] Inventors: Yukiharu Akiyama, Tenri; Shin-ichi Sato, Nara, both of Japan

[73] Assignee: Sharp Kabushiki Kaisha, Japan

[21] Appl. No.: 248,148

[22] Filed: May 24, 1994

[30]  Foreign Application Priority Data

May 27, 1993 [JP] Japan .................................. 5-126342

[51] Int. Cl.$^6$ ................................................. H01L 27/02
[52] U.S. Cl. .......................... 257/316; 257/326; 257/372; 257/67; 365/185.01
[58] Field of Search ...................................... 257/315, 316, 257/326, 369, 69, 350; 365/185

[56]  References Cited

U.S. PATENT DOCUMENTS

| | | | |
|---|---|---|---|
| 4,593,453 | 6/1986 | Tam et al. | 257/67 |
| 5,057,889 | 10/1991 | Yamada et al. | 257/61 |
| 5,223,451 | 6/1993 | Uemura et al. | 257/314 |
| 5,243,559 | 9/1993 | Murai | 257/314 |
| 5,294,811 | 3/1994 | Aoyama et al. | 257/59 |

FOREIGN PATENT DOCUMENTS 4-348568  12/1992  Japan .

OTHER PUBLICATIONS

Koyama, "A Novel Cell Structure for Giga-bit EPROMs and Flash Memories Using Polysilicon Thin Film Transistors", 1992 Symposium on VLSI Technology Digest Technical Papers, pp. 44–45.

*Primary Examiner*—Robert P. Limanek
*Attorney, Agent, or Firm*—Nixon & Vanderhye

[57]  ABSTRACT

An Electrically Erasable PROM ($E^2$PROM) according to the present invention includes a semiconductor substrate of a first conductivity type having a field oxide formed on a predetermined region of the main surface thereof; a memory section formed on the semiconductor substrate; and a peripheral circuit section formed in the peripheral of the memory section, wherein the peripheral circuit section has a CMOS structure in which an N-channel MOS transistor and a P-channel MOS transistor are connected to each other in a complementary manner; one of the N-channel MOS transistor and the P-channel MOS transistor is a thin film transistor formed on the field oxide and the other is a MOS transistor formed on the semiconductor substrate; and the memory section includes a plurality of non-volatile transistors formed on the semiconductor substrate.

5 Claims, 5 Drawing Sheets

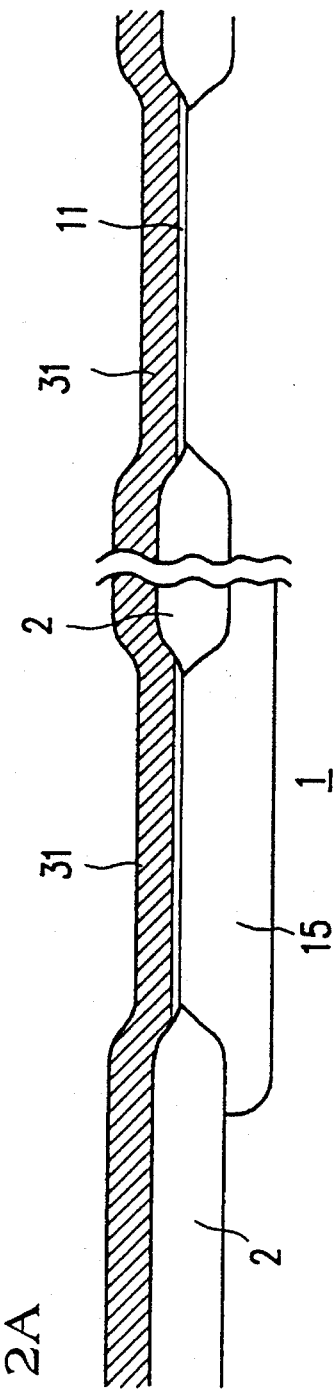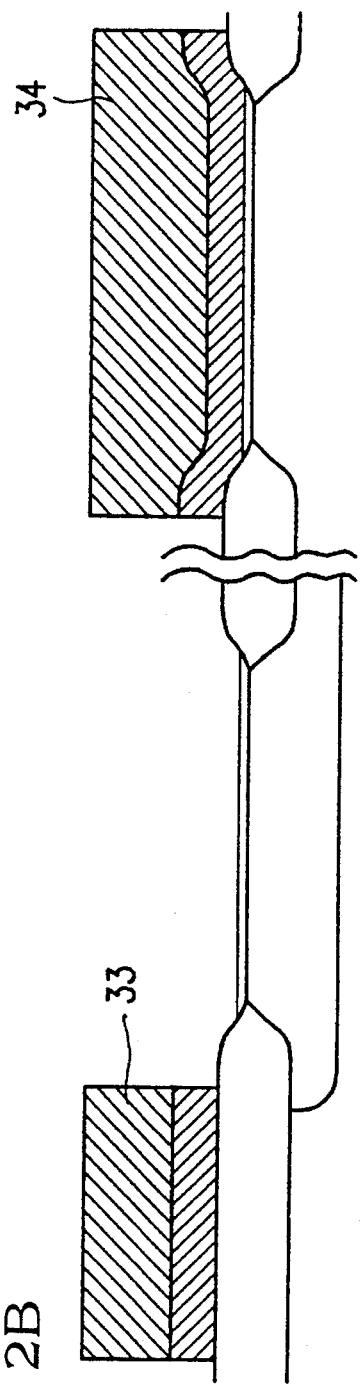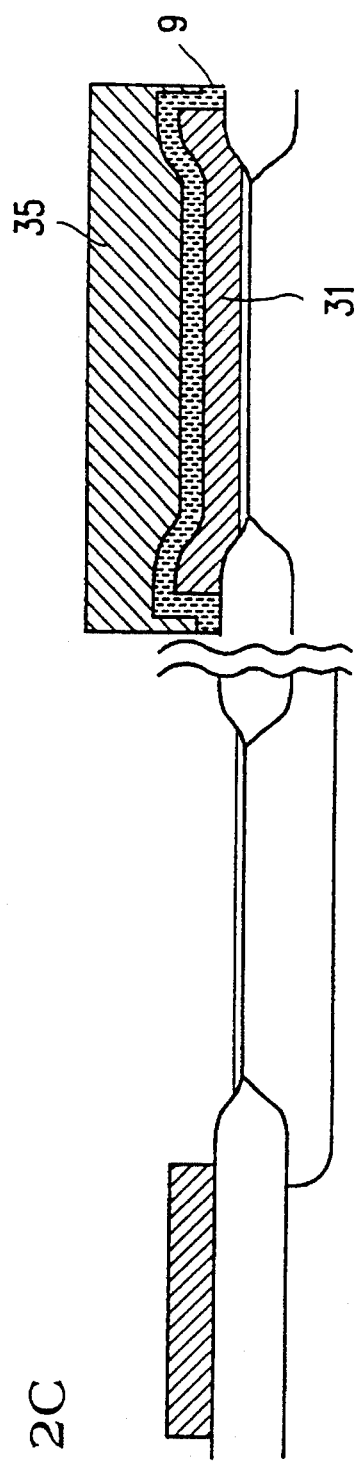

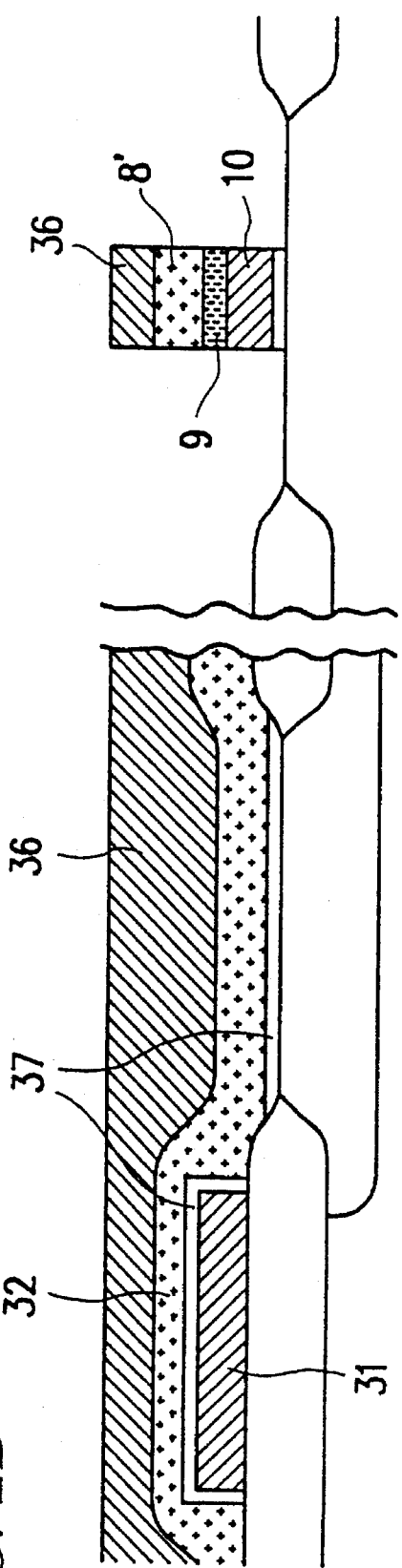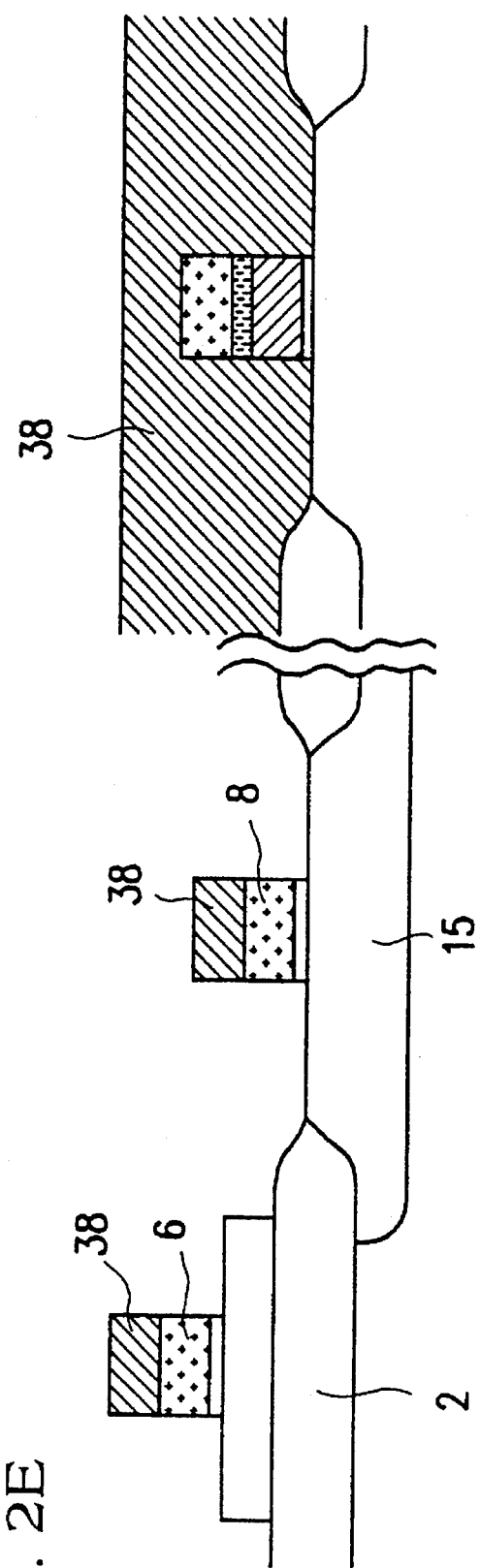

Positive bias erasing method

Negative bias erasing method 5,493,139

ELECTRICALLY ERASABLE PROM (E²PROM) WITH THIN FILM PERIPHERAL TRANSISTOR

BACKGROUND OF THE INVENTION

1. Field of the Invention

The present invention relates to a non-volatile semiconductor memory device, and more particularly, to an Electrically Erasable PROM (E²PROM) and a method for fabricating the same.

2. Description of the Related Art

An E²PROM includes a semiconductor chip on which a memory section having a plurality of memory cell transistors and a peripheral circuit section are formed. In the E²PROM, non-volatile transistors are used as the memory cell transistors.

FIGS. 3 and 4 show a cross-sectional structure of a typical memory cell transistor used in the E²PROM. The memory cell transistor includes a P-type silicon substrate 51, on which a gate oxide 52, a floating gate 53, an ONO film 54, and a control gate 55 are formed in this order, as shown in FIG. 3. The ONO film 54 is formed of three layers (i.e., two $SiO_2$ films and an SiN film interposed therebetween). The ONO film 54 electrically insulates the floating gate 53 from the control gate 55. The floating gate 53 is surrounded by an insulating film and in an electrically floating state. However, the floating gate 53 is capacitively coupled with the control gate 55, and the electrical potential of the floating gate 53 is controlled by the control gate 55. A source 56 and a drain 57 are formed of N-type diffusion layers in the P-type silicon substrate 51.

In the E²PROM, electric carriers stored in the floating gate 53 can be released to the outside by applying a relatively high voltage between the control gate 55 and the source region 56. In this area, the E²PROM can be more easily handled than an EPROM in which the UV-ray irradiation is used for releasing the electric carriers.

Erasing methods of data in the E²PROM include a positive bias erasing method and a negative bias erasing method. According to the positive bias erasing method, as shown in FIG. 3, a gate 58 is set at 0 volts; a positive high bias voltage (such as 12 volts) is applied to the source region 56; and the drain region 57 is set at Floating. In this method, a breakdown is avoided between the source region 56 and the substrate 51, so that the source region 56 is formed of a double diffusion structure having a diffusion region of a low concentration. However, a longer gate length is required, resulting in some difficulty in reducing the size of the memory cell.

According to the negative bias erasing method, as shown in FIG. 4, a negative bias (such as −12 volts) is applied to the gate 58; the source region 56 is set at 5 volts; and the drain region 57 is set at Floating. In this method, the source region 56 can be low-biased (such as 5 volts), so that no breakdown occurs between the source region 56 and the substrate 51. Accordingly, it is not necessary to form the source region 56 in the double diffusion structure, thereby shortening the gate length. Thus, the negative bias erasing method has been proposed for reducing the size of a memory cell of the E²PROM.

In an E²PROM, the peripheral circuit section has a CMOS (Complementary MOS) in order to lower the consumption of power. FIGS. 5A and 5B show structures of the CMOS in which a P-type single crystalline silicon is used as the substrate 51. In this CMOS, as shown in FIG. 5A, MOS transistors of an N-channel type and a P-channel type are isolated by a field oxide 90. In the case of employing the P-type silicon substrate 51, an N-channel transistor 71 in the peripheral circuit section has a source ($N^+$-type source) region 76 and a drain ($N^+$-type drain) region 77 which are formed as the N-type diffusion layers in a P-type region 72 (hereinafter, referred to as a P-type well), the source region 76 and the drain region 77 being formed in the P-type substrate 51 in the vicinity of the surface thereof. An insulating layer 79 made of a silicon oxide is formed on the surface of the substrate 51, overlapping ends of the source 76 and the drain 77. A gate 78 is formed on such an insulating layer 79.

In a P-channel transistor 81 of the peripheral circuit, an N-type region 83 of a relatively low concentration (hereinafter, referred to an N-type well) is formed in the substrate 51 in the vicinity of the surface thereof, since the substrate 51 is of the P type. The N-type well 83 includes a source ($P^+$-type source) region 86 and a drain ($P^+$-type drain) region 87 of the P-type diffusion layer.

An insulating layer 89 made of an oxide film is formed on the surface of the substrate 51, overlapping both ends of the source 86 and the drain 87. A gate 88 is formed on such an insulating layer 89.

When the negative bias erasing method is performed in the E²PROM having such a CMOS peripheral circuit section, as shown in FIG. 5B, a negative bias should be applied to the N-channel transistor 71 of the peripheral circuit section, in order to remove electrons from the floating gate 53 of the memory cell transistor. In this case, however, PN junctions between the source/drain of the N-channel transistor of the peripheral circuit section and the substrate receive a forward bias, so that a larger current flows through the PN junctions. Thus, the above method cannot work. Accordingly, the P-type substrate 51 and the P-type well 72 should be electrically separated from each other when the negative bias is applied to the P-type well 73 of the peripheral circuit. As a result, as shown in FIG. 5C, the P-type well 72 should be surrounded by a deep N-type well 73.

In order to surround the P-type well 72 with the deep N-type well 73, a large area for double well structure is required, resulting in an increase of the chip size. Thus, an advantage in that the negative bias erasing method reduces the chip size cannot be attained.

SUMMARY OF THE INVENTION

An Electrically Erasable PROM (E²PROM) according to the present invention comprises a semiconductor substrate of a first conductivity type having a field oxide formed on a predetermined region of a main surface thereof; a memory section formed on the semiconductor substrate; and a peripheral circuit section formed in the peripheral of the memory section, wherein the peripheral circuit section has a CMOS structure in which an N-channel MOS transistor and a P-channel MOS transistor are connected to each other in a complementary manner; one of the N-channel MOS transistor and the P-channel MOS transistor is a thin film transistor formed on the field oxide and the other is a MOS transistor formed on the semiconductor substrate; and the memory section includes a plurality of non-volatile transistors formed on the semiconductor substrate.

In one embodiment of the invention, the non-volatile transistor includes a source region and a drain region formed in the semiconductor substrate, the source region and the drain region each being formed of an impurity diffusion layer of a second conductivity type which is a single layer; and the MOS transistor includes a source region and a drain region formed in the semiconductor substrate and formed of an impurity diffusion layer of a first conductivity type, the source region and the drain region each being formed in a single well of a second conductivity type in the semiconductor substrate.

In another embodiment of the invention, the thin film transistor is of a stagger type.

In still another embodiment of the invention, the thin film transistor is of an inverted stagger type.

A method for fabricating an E$^2$PROM including a non-volatile transistor of a memory section, a thin film transistor and an MOS transistor of a peripheral circuit section, according to the present invention, comprises the steps of: forming a field oxide and a gate oxide on a main surface of a semiconductor substrate, and then depositing a polycrystalline silicon film so as to cover the field oxide and the gate oxide; forming a first thin film semiconductor layer, which becomes a floating gate of the non-volatile transistor, on a predetermined region of the gate oxide by etching a predetermined portion of the polycrystalline silicon film, and forming a second thin film semiconductor layer, used for the thin film transistor, on the field oxide; forming an insulating film on the first thin film semiconductor layer; forming a gate insulating film of the thin film transistor on the second thin film transistor layer; depositing a conductive film over the semiconductor substrate; forming a control gate of the non-volatile transistor from the conductive film by selectively etching predetermined portions of the conductive film, the insulating film, and the first thin film semiconductor layer, and then forming the floating gate from the first thin film semiconductor layer; and forming a gate electrode of the thin film transistor and a gate electrode of the MOS transistor from the conductive film, by selectively etching other predetermined portions of the conductive film.

In one embodiment of the invention, the conductive film is a second polycrystalline silicon film deposited by a chemical vapor deposition.

In another embodiment of the invention, the conductive film is a refractory material film deposited by a chemical vapor deposition.

In still another embodiment of the invention, the step of forming the insulating film on the first thin film semiconductor layer includes a step of forming a first silicon oxide film, a silicon nitride film, and a second silicon oxide film in this order.

In still another embodiment of the invention, the step of forming the insulating film on the first thin film semiconductor layer includes the steps of: forming the first silicon oxide film by thermally oxidizing the first thin film semiconductor layer; depositing the silicon nitride film on the first silicon oxide film by a chemical vapor deposition; and depositing the second silicon oxide film on the silicon nitride film by the chemical vapor deposition.

In still another embodiment of the invention, the step of forming the insulating film on the first thin film semiconductor layer includes the steps of: forming the insulating film over the semiconductor substrate; and removing portions of the insulating film other than a portion on the first thin film semiconductor layer by a photolithography technique and an etching technique.

In still another embodiment of the invention, the method further comprises a step of doping the second thin film semiconductor layer with impurities by using the gate electrode of the thin film transistor as a mask, thereby making a source region and a drain region of the thin film transistor in self-alignment with the gate electrode.

In still another embodiment of the invention, a source region and a drain region of the non-volatile transistor are also formed in the step of doping impurities.

Alternatively, a method for fabricating an E$^2$PROM including a non-volatile transistor of a memory section, a thin film transistor and an MOS transistor of a peripheral circuit section, according to the present invention, comprises the steps of: forming a field oxide and a gate oxide on a main surface of a semiconductor substrate, and then depositing a first polycrystalline silicon film so as to cover the field oxide and the gate oxide; forming a first thin film semiconductor layer, which becomes a floating gate of the non-volatile transistor, on a predetermined region of the gate oxide by etching a predetermined portion of the first polycrystalline silicon film, and forming a gate electrode of the thin film transistor on the field oxide; forming an insulating film on the first thin film semiconductor layer; forming a gate insulating film on the gate electrode of the thin film transistor; depositing a second polycrystalline silicon film over the semiconductor substrate; forming a control gate of the non-volatile transistor from the second polycrystalline silicon film, by selectively etching predetermined portions of the second polycrystalline silicon film, the insulating film, and the first thin film semiconductor layer, and then forming the floating gate from the first thin film semiconductor layer; and forming a second thin film semiconductor layer used for the thin film transistor and a gate electrode of the MOS transistor, from the second polycrystalline silicon film, by selectively etching other predetermined portions of the second polycrystalline silicon film.

In one embodiment of the invention, the step of forming the insulating film on the first thin film semiconductor layer includes a step of forming a first silicon oxide film, a silicon nitride film, and a second silicon oxide film in this order.

In another embodiment of the invention, the step of forming the insulating film on the first thin film semiconductor layer includes the steps of: forming the first silicon oxide film by thermally oxidizing the first thin film semiconductor layer; depositing the silicon nitride film on the first silicon oxide film by a chemical vapor deposition; and depositing the second silicon oxide film on the silicon nitride film by the chemical vapor deposition.

In still another embodiment of the invention, the step of forming the insulating film on the first thin film semiconductor layer includes the steps of: forming the insulating film over the semiconductor substrate; and removing portions of the insulating film other then a portion on the first thin film semiconductor layer by a photolithography technique and an etching technique.

Thus, the invention described herein makes possible the advantages of (1) providing an E$^2$PROM of a structure in which the chip size is reduced and (2) providing a method for fabricating the same.

These and other advantages of the present invention will become apparent to those skilled in the art upon reading and understanding the following detailed description with reference to the accompanying figures.

BRIEF DESCRIPTION OF THE DRAWINGS

FIGS. 2A through 2E are cross-sectional views of an E²PROM of the present invention at various stages of the fabrication processes.

DESCRIPTION OF THE PREFERRED EMBODIMENTS

Hereinafter, the present invention will be described by way of examples, with reference to the accompanying drawings.

Figure 1:
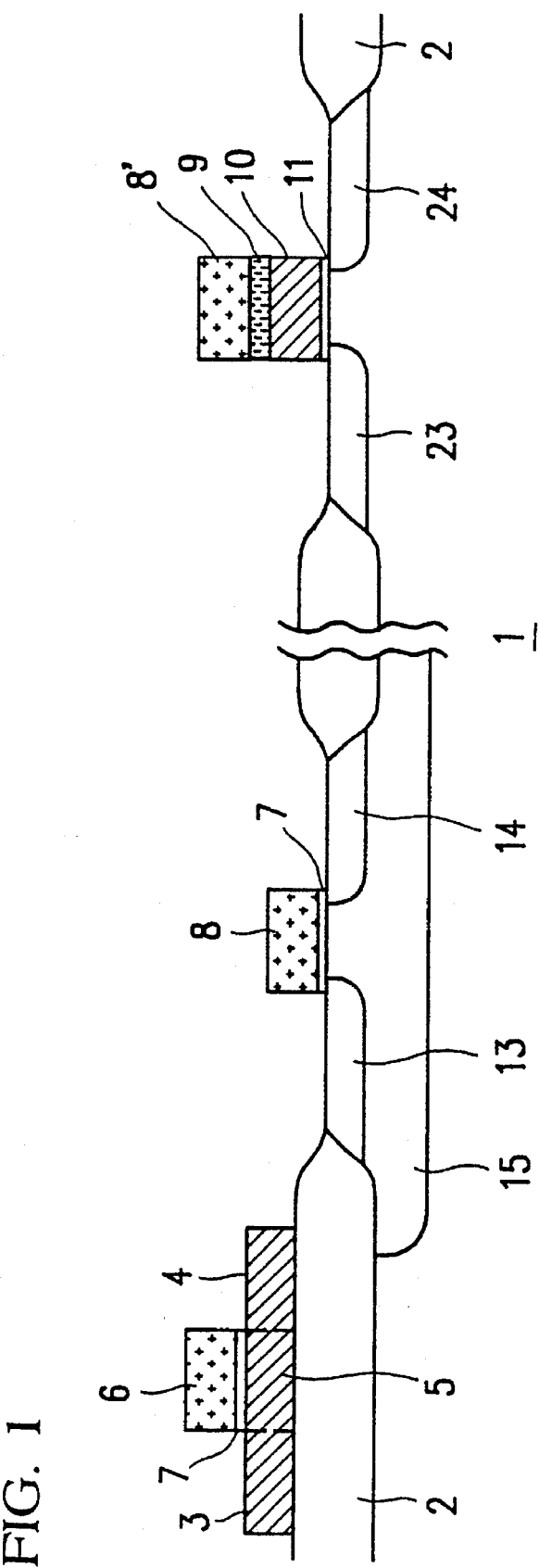
FIG. 1 is a cross-sectional view of a peripheral circuit section and a memory section of an E$^2$PROM of the present invention.
Figure 3:
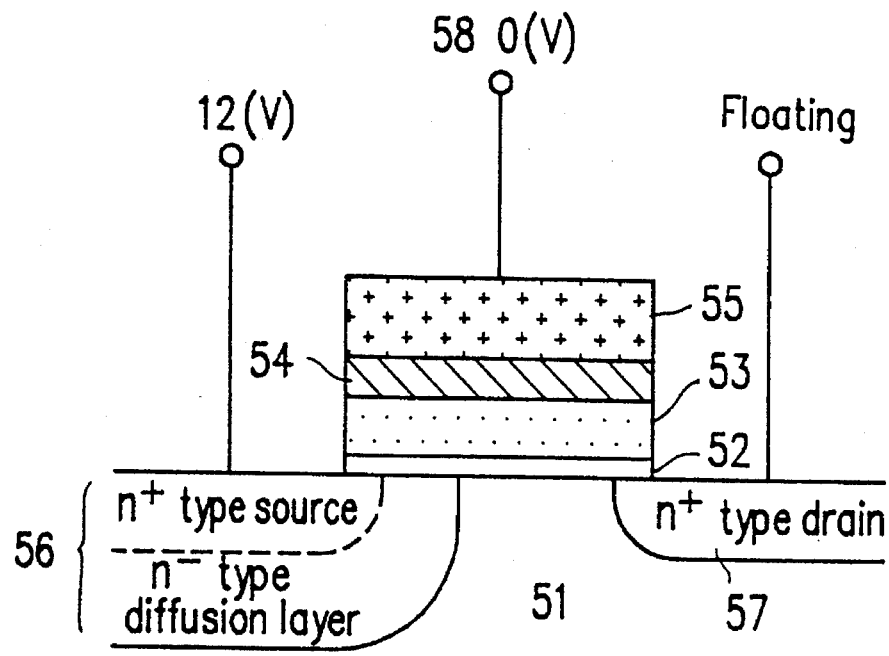
FIG. 3 is a diagram showing a positive bias erasing method of an E²PROM.

FIG. 1 is a cross-sectional view showing the main portion of a peripheral circuit section and memory section of an E²PROM according to the present invention. In this figure, the left portion side of the vertical wavy lines shows a partial cross-sectional view of the peripheral circuit section and the right portion shows a partial cross-sectional view of the memory section.

In this example, a P-type single crystalline silicon substrate 1 is used as a substrate. A field oxide 2 is formed on a prescribed region of the main surface of the silicon substrate 1. The peripheral circuit section has a CMOS structure in which an N-channel MOS transistor and a P-channel MOS transistor are connected to each other in a complementary manner. According to the present invention, the N-channel MOS transistor is a thin film transistor (a TFT) formed on the field oxide 2. On the other hand, the P-channel MOS transistor is a MOS transistor formed on the silicon substrate 1. In this figure, only one N-channel MOS transistor and one P-channel MOS transistor are included in the peripheral circuit section. In reality, however, a plurality of transistors are included in the peripheral circuit section. These transistors form a peripheral circuit for driving the memory section and are designed to realize the desired circuit operation.

Figure 4:
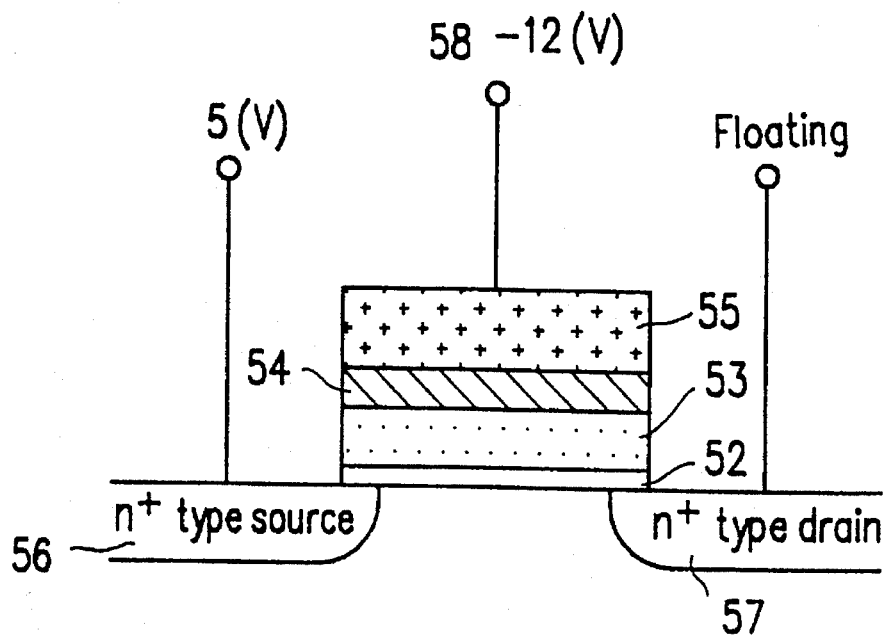
FIG. 4 is a diagram showing a negative bias erasing method of an E²PROM.
Figure 5A:
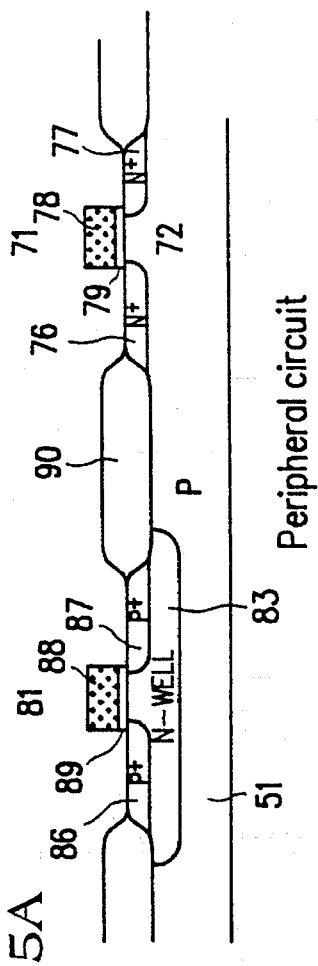
FIGS. 5A through 5C are diagrams showing a peripheral circuit section of a conventional E²PROM.
Figure 5B:
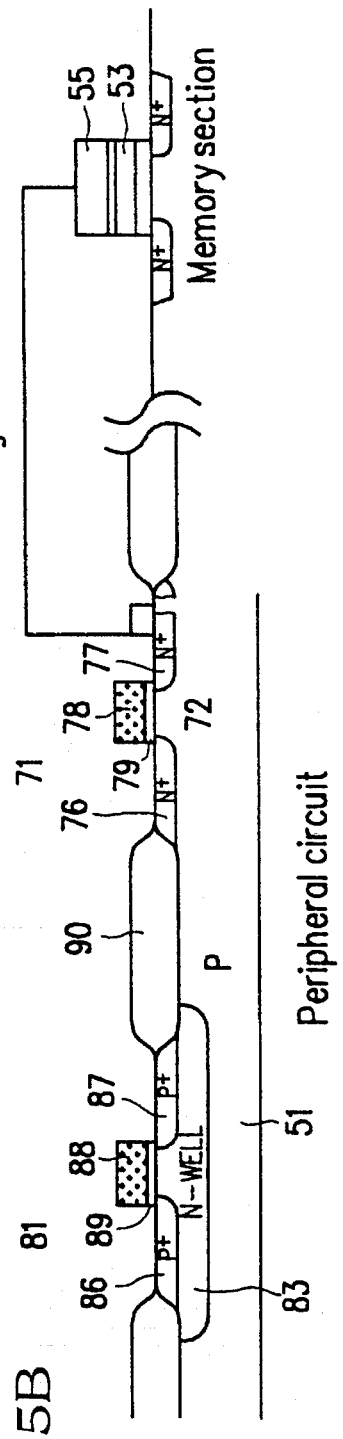
Figure 5C:
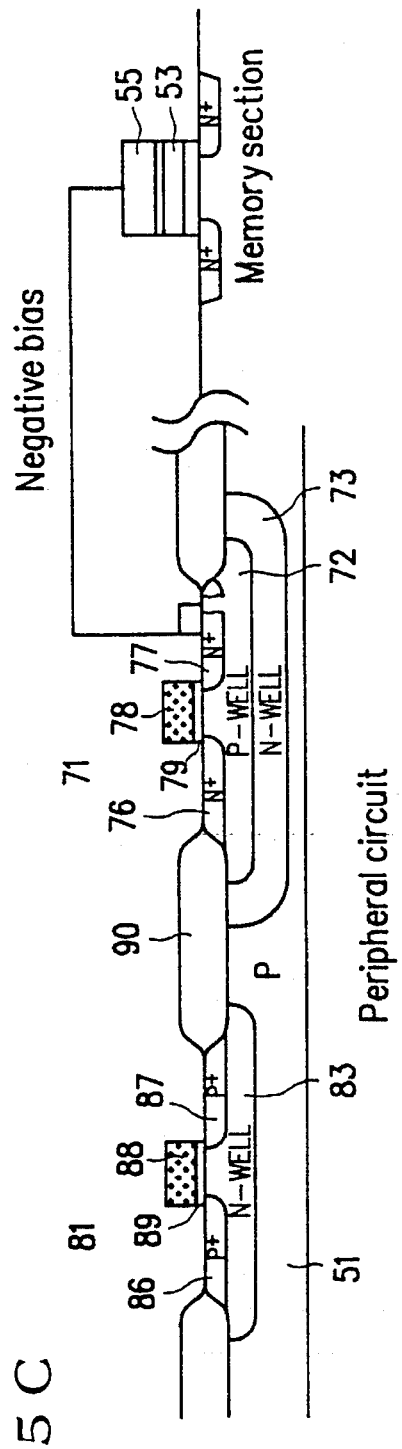

The memory section includes a plurality of non-volatile transistors (memory cell transistors) arranged in a matrix. The transistor of this figure is a typical one of these non-volatile transistors. A detailed structure of this memory cell transistor is the same as that of the conventional memory cell transistor as shown in FIG. 4.

The structure of respective parts of the transistor will be described in detailed with reference to FIG. 1.

The TFT of this example includes a thin film semiconductor layer (made of a polycrystalline silicon film) formed on the field oxide 2, on which a gate insulating film 7 of $SiO_2$ and a gate electrode 6 are formed in this order. The TFT is of a stagger type. In the thin film semiconductor layer, an $N^+$-type source 3, a channel layer 5, and an $N^+$-type drain 4 are arranged in this order from the left side of the figure.

In the peripheral circuit section, an N-type well 15 is formed in the substrate 1 in the vicinity of the surface thereof. Within the most upper portion of the N-type well 15, a $P^+$-type source 13 and a $P^+$-type drain 14 of the P-channel MOS transistor are formed with a predetermined distance therebetween. An insulating film 7 made of silicon oxide is formed on the surface of the silicon substrate 1, overlapping ends of the $P^+$-type source 13 and the $P^+$-type drain 14. A gate electrode 8 is formed on the insulating film 7. The P-channel MOS transistor is connected to the TFT on the field oxide 2 via an interconnection (not shown), thereby forming the peripheral circuit of the CMOS structure. The peripheral circuit is connected to control gates of the memory cell transistors of the memory section, thereby controlling read/write operations of the memory cell transistors.

Each of the memory cell transistors of the memory section includes an $N^+$-type source 23 and an $N^+$-type drain 24 formed in an active region of the substrate 1. The memory cell transistor further includes an insulating film 11 made of silicon oxide, a floating gate 10, an ONO film 9, and a control gate 8'. The insulating film 11 is formed on the silicon substrate 1, overlapping ends of the $N^+$-type source 23 and the $N^+$-type drain 24.

The above structure overcomes the problems of the prior art in which the N-channel transistors of the peripheral circuit section are formed on the surface of the silicon substrate. More particularly, according to the present invention, the following effects can be obtained.

(1) The source region of the non-volatile transistor is formed from an impurity diffusion layer of a signal layer, thereby reducing the channel length of the memory cell transistor.

(2) The N-channel transistor of the peripheral circuit section is formed on the field oxide 2, thereby reducing the chip size.

(3) The negative bias erasing method can be performed without employing the double well structure.

Referring to FIGS. 2A through 2E, a production method of the E²PROM as shown in FIG. 1 will be described below.

First, the P-type silicon substrate 1 doped with boron (B) is oxidized in an ambient containing oxygen at a high temperature, so that a silicon oxide film is grown on the surface of the silicon substrate 1. A resist pattern which has an opening corresponding to the N-type well 15 is formed on the silicon oxide film by a photolithography technique. The opening of the resist pattern defines the location and the shape of the N-type well 15.

The exposed surface region of the silicon substrate 1 is implanted with N-type impurity ions ($^{31}P^+$, 60 KeV $5\times10^{12}/cm^2$) through the opening of the resist pattern. After the resist pattern is removed, the implanted phosphorus ($P^+$) ions are diffused at a temperature of 1100° C. for 240 minutes, thereby forming the N-type well 15.

A thermal oxide film is grown over the substrate 1 so as to have a thickness of 14 nm, and a silicon nitride ($Si_xN_y$) film is deposited thereon by a CVD method so as to have a thickness of 120 nm. By using an ordinary photolithography technique and an etching technique, the thermal oxide film and the silicon nitride ($Si_xN_y$) film are selectively removed from the substrate other than the region which becomes the active region. The silicon nitride ($Si_xN_y$) film is used for an oxidation stop mask. Next, by performing a wet oxidation at a temperature of 1050° C., the field oxide 2 is locally formed so as to have a thickness of 400 nm on a portion of the silicon substrate 1 which is not covered with the silicon nitride film. The field oxide 2 electrically isolates respective memory cell transistors from each other.

After the silicon nitride ($Si_xN_y$) film is removed by phosphoric acid, the thermal oxide film as the base film is removed by a solution of hydrofluoric acid. Then, an exposed surface (i.e., active region) of the silicon substrate 1 is thermally oxidized, thereby forming a thin oxide film with a thickness of 10 nm. The thin oxide film becomes the gate oxide 11 of the memory cell transistor.

Next, a first polycrystalline silicon film 31 is deposited over the substrate 1 by the CVD method so as to have a thickness of 100 nm as shown in FIG. 2A. The polycrystalline silicon film 31 becomes the thin film semiconductor layer of the TFT and the floating gate of the non-volatile transistor in the succeeding process.

Next, resists 33 and 34 are formed on the polycrystalline silicon film 31 by using the photolithography technique (FIG. 2B). The resist 33 covers a portion of the polycrystalline silicon film 31 which becomes the thin film semiconductor layer of the TFT. The resist 34 covers a portion of the active layer region of the memory section where the non-volatile transistor is to be formed. An exposed portion of the polycrystalline silicon film 31 is etched by using the resists 33 and 34 as etching masks, thereby patterning the polycrystalline silicon film 31 into a predetermined shape. The structure as shown in FIG. 2B is obtained in this way.

After removing the resists 33 and 34, the ONO film 9 is formed on the patterned polycrystalline silicon film 31. The ONO film 9 has a multi-layer structure in which a first $SiO_2$ film of 10 nm, an SiN film of 20 nm, and a second $SiO_2$ film of 10 nm are formed in this order. The first $SiO_2$ film is obtained by thermally oxidizing the surface of the polycrystalline silicon film 31. The SiN film and the second $SiO_2$ film are obtained by the CVD method.

As is shown in FIG. 2C, a resist 35 is formed on part of the polycrystalline silicon film 31 by the photolithography technique. The resist 35 covers part of the ONO film 9, corresponding to a portion of the polycrystalline silicon film 31 which covers the active region of the memory section. Then, a portion of the ONO film 9 which is not covered with the resist 35 is removed by etching.

As is shown in FIG. 2D, an $SiO_2$ film 37 is formed by thermal oxidation so as to have a thickness of 25 nm. Then, the substrate 1 is entirely covered with the $SiO_2$ film and a second polycrystalline silicon film 32 is deposited on the resulting substrate 1 so as to have a thickness of 100 nm. The second polycrystalline silicon film 32 becomes the gate electrode 6 of the TFT, the gate electrode 8 of the P-channel MOS transistor, and the control gate 8' of the non-volatile transistor in the succeeding process. Instead of the second polycrystalline silicon film 32, an electrically conductive film (e.g., refractory metal film or refractory metal silicide film) may be employed as a film for the gate electrodes of the transistors.

In the memory section, the polycrystalline silicon film 32, the ONO film 9, and the polycrystalline silicon film 31 are patterned, thereby forming the control gate 8' of the non-volatile transistor. During this etching step, the peripheral circuit section should be covered with a resist 36 (FIG. 2D). After removing the resist 36, the residual of the polycrystalline silicon film 32, which is left in the peripheral circuit, is patterned, thereby forming the gate electrode 6 of the TFT and the gate electrode 8 of the P-channel MOS transistor as shown in FIG. 2E. During this etching step, the memory section should be covered with a photoresist 38.

After covering the TFT and the non-volatile transistor with a photoresist (now shown), the N-type well 15 of the peripheral circuit section is implanted with P-type impurity ions ($^{11}B^+$, 15 KeV, $2\times10^{15}/cm^2$). In this way, the $P^+$-type source 13 and the $P^+$-type drain 14 of the P-channel MOS transistor are formed in self-alignment with the gate electrode 8.

After covering the P-channel transistor of the peripheral circuit section with a photoresist (not shown), exposed surfaces of the thin film semiconductor layer of the TFT and the silicon substrate 1 of the memory section are implanted with N-type impurity ions ($^{75}As^+$, 15 KeV, $2\times10^{15}/cm^2$). In this way, the $N^{30}$-type source 3 and the $N^+$-type drain 4 of the TFT, and the $N^+$-type source 23 and the $N^+$-type drain 24 of the memory section are simultaneously formed, thereby forming the semiconductor memory device of FIG. 1.

In the semiconductor memory device as shown in FIG. 1, an interlevel insulator and metal interconnections are formed (not shown). These are formed in the following conventional manner:

First, an $SiO_2$ film with a thickness of 100 nm and a boro-phosphorus silicate glass (BPSG) film with a thickness of 500 nm are successively deposited and are subjected to a reflow process at a temperature of 900° C. for 10 minutes, thereby plannerizing the BPSG film. After forming contact holes in a predetermined portion of the BPSG film, Al-Si-Cu film is deposited on the BPSG film so as to have a thickness of 500 nm. Finally, the Al-Si-Cu film is patterned by the photolithography and etching techniques, thereby forming the metal interconnections.

While the P-type substrate is used in this example, an N-type substrate may be used. In the case of the N-type substrate, an impurity of a reversed conductivity type of that of this example is used. For example, a P-type thin film transistor is formed on the field oxide of the peripheral circuit section.

While the TFT of the stagger structure is used in the semiconductor memory device of this example, a TFT of an inverted stagger type may be also used. In this case, the gate of the TFT is formed as well as the floating gate of the memory cell transistor from the first polycrystalline silicon film 31. The thin film semiconductor layer of the TFT (on which a channel and the like are formed) is formed as well as the control gate of the memory cell transistor from the second polycrystalline silicon film 32.

As is mentioned above, the chip size of the semiconductor memory device can be reduced according to the present invention, resulting in a smaller size of portable information electrical appliances and the like.

In the case where the TFT of the stagger type is formed on the field oxide of the peripheral circuit, the thin film semiconductor layer of the TFT and the floating gate 10 of the memory cell transistor may be formed from the first polycrystalline silicon film 31. In addition, the gate 6 of the TFT, the gate 8 of the transistor of the peripheral circuit section, and the control gate 8' of the transistor of the memory section may be formed from the second polycrystalline film 32. Accordingly, a semiconductor memory device having an excellent performance can be fabricated without increasing the process steps.

Various other modification will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An Electrically Erasable PROM ($E^2$PROM) in which a negative bias method is used for a erasure operation, the $E^2$PROM comprising:

a semiconductor substrate of a first conductivity type having a field oxide formed on a predetermined region of a main surface;

a memory section formed on the semiconductor substrate, the memory section including a plurality of second channel type non-volatile transistors formed on the semiconductor substrate, each of the nonvolatile transistors having a floating gate and a control gate; and a peripheral circuit section formed in the peripheral of the memory section, wherein the peripheral circuit section has a CMOS structure in which a first channel type MOS transistor and a second channel type MOS transistor are connected to each other in a complementary manner; and wherein the second channel MOS transistor is a thin film transistor formed on the field oxide and the first channel MOS transistor is a MOS transistor formed on the semiconductor substrate.

2. An $E^2$PROM transistor according to claim 1, wherein the non-volatile transistor includes a source region and a drain region formed in the semiconductor substrate, the source region and the drain region each being formed of an impurity diffusion layer of a second conductivity type which is a single layer; and the MOS transistor includes a source region and a drain region formed in the semiconductor substrate and formed of an impurity diffusion layer of a first conductivity type, the source region and the drain region each being formed in a single well of the second conductivity type in the semiconductor substrate.

3. An $E^2$PROM according to claim 1, wherein the thin film transistor is of a stagger type.

4. An $E^2$PROM according to claim 1, wherein the thin film transistor is of an inverted stagger type.

5. An $E^2$PROM according to claim 1, wherein the control gate of each of the non-volatile transistors and a drain of the second channel MOS transistor receive a negative bias during an erasing operation.

* * * * *